(12) United States Patent
Takashima

(10) Patent No.: US 6,750,493 B2
(45) Date of Patent: Jun. 15, 2004

(54) SEMICONDUCTOR STORAGE DEVICE INCLUDING NONVOLATILE FERROELECTRIC MEMORY

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/385,714

(22) Filed: Mar. 12, 2003

(65) Prior Publication Data
US 2003/0173606 A1 Sep. 18, 2003

(30) Foreign Application Priority Data
Mar. 12, 2002 (JP) ........................... 2002-067496

(51) Int. Cl.[7] ............................... H01L 31/062
(52) U.S. Cl. ................ 257/295; 257/E27.104
(58) Field of Search ............ 257/295, E27.104

(56) References Cited

U.S. PATENT DOCUMENTS 6,614,678 B2 * 9/2003 Kato et al. ............. 365/145

* cited by examiner

Primary Examiner—David Nelms
Assistant Examiner—Tu-Tu Ho
(74) Attorney, Agent, or Firm—Oblon, Spivak, McClelland, Maier & Neustadt, P.C.

(57) ABSTRACT

A first memory cell block has memory cells connected together in series. Each of the memory cells comprises a cell transistor and a ferroelectric capacitor. The ferroelectric capacitor has an electrode at one end and an electrode at the other end which are connected to a source and a drain of the cell transistor, respectively. A first metal interconnect is connected between one end of the first block and one end of a current path in a first block selection transistor. A first bit line is connected to the other end of the current path in the first transistor. A second bit line is arranged adjacent to the first bit line. Second and third block selection transistors each have a current path one end of which is connected to the second bit line. Interconnects connected to gate electrodes of the second and third transistors are disposed below the first interconnect.

12 Claims, 8 Drawing Sheets

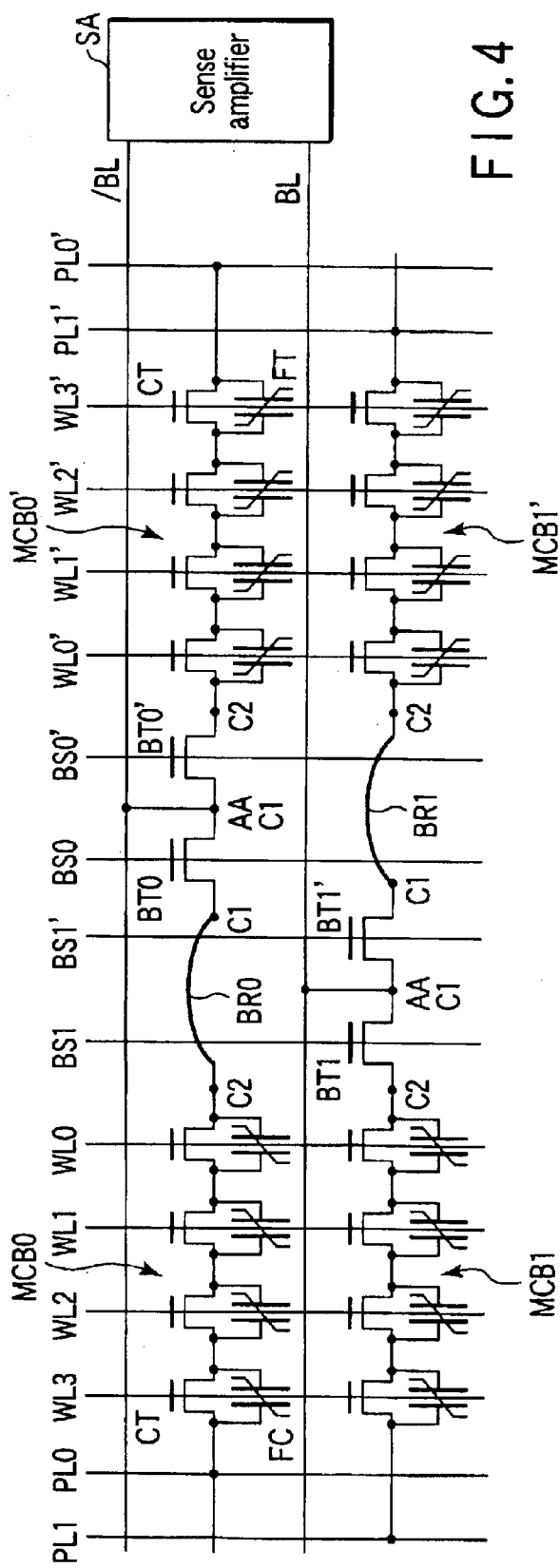
FIG. 4
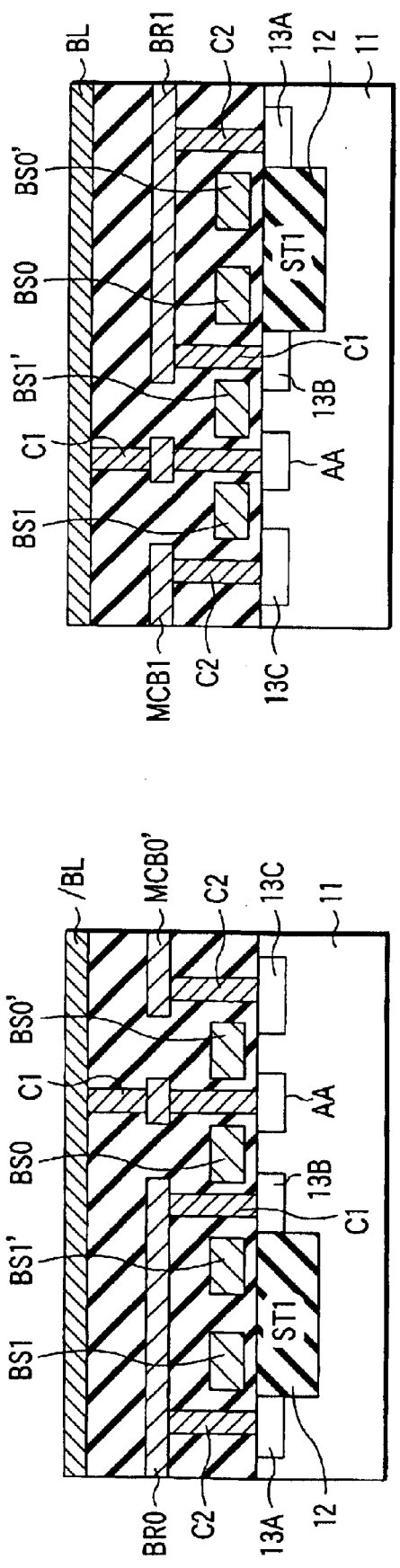
FIG. 5A
FIG. 5B

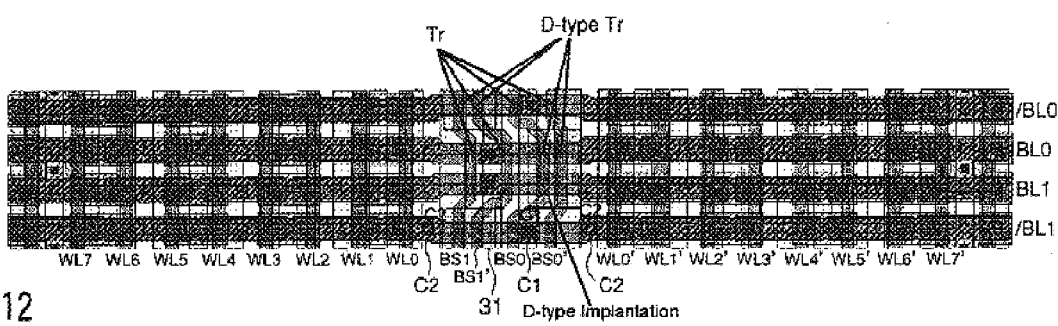
F I G. 12
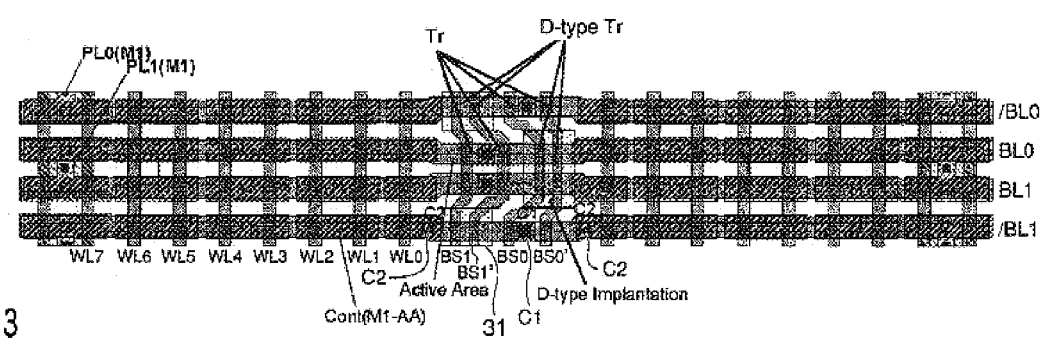
F I G. 13

SEMICONDUCTOR STORAGE DEVICE INCLUDING NONVOLATILE FERROELECTRIC MEMORY

CROSS-REFERENCE TO RELATED APPLICATIONS

This application is based upon and claims the benefit of priority from the prior Japanese Patent Application No. 2002-067496, filed Mar. 12, 2002, the entire contents of which are incorporated herein by reference.

BACKGROUND OF THE INVENTION

1. Field of the Invention

The present invention relates to a semiconductor storage device, and in particular, to a nonvolatile ferroelectric memory.

2. Description of the Related Art

Today, semiconductor memories are utilized in various applications, including main memories of large-scale computers as well as personal computers, electric appliances, and cellular phones. Semiconductor memories on the market include volatile DRAMs (Dynamic Random Access Memories), SRAMs (Static Random Access Memories), nonvolatile MROMs (Mask Read Only Memories), and Flash EEPROM (Flash Electrically Erasable and Programmable Read Only Memories).

In particular, the DRAM is a volatile memory but is excellent in cost (its cell area is a quarter of that of an SRAM) and speed (it operates faster than a Flash EEPROM). Thus, DRAMs now occupy the largest market share.

Further, a rewritable nonvolatile Flash EEPROM is nonvolatile and thus its power supply can be turned off. However, the number of times this Flash EEPROM can be rewritten (the number of W/Es) is only about $10^6$. It takes microseconds to write data in the Flash EEPROM. Furthermore, a high voltage (12V to 22V) must be applied to achieve writes. The Flash EEPROM has such advantages, so that the percentage of the market taken up by the Flash EEPROM is now smaller than that taken up by the DRAM.

In contrast, since a nonvolatile ferroelectric memory employing a ferroelectric capacitor was proposed in 1980, many manufacturers have been making efforts to develop this memory. This is because it is nonvolatile, the number of times it can be rewritten is $10^{12}$, and it can operate at 3V to 5V, etc.

FIG. 1A shows a memory cell in a conventional ferroelectric memory which is composed of one transistor and one capacitor, and a cell array configuration in this memory.

In the memory cell configuration of the conventional ferroelectric memory, a transistor CT and a capacitor FC are connected together in series. The following components are arranged in the cell array: bit lines BL and/BL through which data is read, word lines WL0 and WL1 through which the memory cell transistor CT is selected, and plate lines PL0 and PL1 that drive one end of the ferroelectric capacitor FC. Furthermore, plate line driving circuits PLD0 and PLD1 are connected to the plate lines PL0 and PL1, respectively.

However, this conventional ferroelectric memory has a folded bit line configuration in which one memory cell is arranged per two intersections of the word lines and bit lines, as shown in FIG. 1B. When both interconnect width and interconnect space are defined as F, the minimum cell size is limited to $2F \times 4F = 8F^2$. Thus, disadvantageously, the cell size of the conventional ferroelectric memory is limited to $8F^2$.

Further, in the conventional ferroelectric memory, to prevent destruction of polarization information in the ferroelectric capacitors of non-selected memory cells, the plate lines must be separated from one another so as to correspond to the respective word lines, and must be individually driven. Furthermore, a plurality of ferroelectric capacitors are connected to each plate line in the direction of the word lines. Consequently, the plate line has a large load capacity. Moreover, the pitch with which the plate line driving circuits are arranged must be similar to that with which the word lines are arranged. It is thus impossible to increase the size of each plate line driving circuit. Accordingly, it takes much time to increase or reduce the potential across the plate line. Therefore, the ferroelectric memory operates at low speed.

To solve this problem, the inventor has proposed in Jpn. Pat. Appln. KOKAI Application No. 10-255483, Jpn. Pat. Appln. KOKAI Application No. 11-177036, and Jpn. Pat. Appln. KOKAI Application No. 2000-22010, all of which have been previously filed, a new nonvolatile ferroelectric memory featuring three points that are compatible with one another: (1) small memory cells of size $4F^2$, (2) planar transistors that can be easily manufactured, and a (3) general-purpose fast random access function. FIG. 1C shows a configuration of the ferroelectric memory according to the previous applications.

As shown in FIG. 1C, in this ferroelectric memory, one memory cell is composed of the cell transistor CT and ferroelectric capacitor FC connected together in parallel. One memory cell block MCB is composed of a plurality of parallel-connected memory cells connected together in series. One end of the memory cell block MCB is connected to the bit line BL via a block selection transistor BST. The other end is connected to the plate line PL. Furthermore, the plate line driving circuit PLD is connected to the plate line PL. With this configuration, planar transistors can be used to realize a memory cell 101 with the minimum size of $4F^2$ as shown in FIG. 1D.

The ferroelectric memory shown in FIG. 1C operates as described below. A memory cell transistor and ferroelectric capacitor in a memory cell from which data is to be read are defined as CT1 and C1, respectively. Memory cell transistors and ferroelectric capacitors in other memory cells are defined as CT and FC, respectively. As shown in FIG. 2A, during standby, all word lines WL0 to WL3 are set at a "high" potential, and the memory cell transistors CT and CT1 are turned on. Furthermore, a signal interconnect BS0 of a block selection transistor BT0 is set at a "low" potential, with the block selection transistor BT0 turned off. Then, the opposite ends of each of the ferroelectric capacitors FC and C1 are electrically shorted by a corresponding one of turned-on cell transistors CT and CT1. Thus, no difference in potential occurs across each of the ferroelectric capacitors FC and C1. Storage polarization is therefore stably retained. FIG. 2B shows a hysteresis curve for the polarization capacity of the ferroelectric capacitor during standby.

Further, in operation, only the memory cell transistor connected together in parallel to a ferroelectric capacitor from which data is to be read is turned off. The other memory cell transistors are turned on. Furthermore, the block selection transistor is turned on.

For example, as shown in FIG. 2C, if the ferroelectric capacitor C1 is to be selected which belongs to the ferroelectric memory cell composed of the memory cell transistor CT1 and this ferroelectric capacitor C1, then the word line W2 is set to the "low" potential. Subsequently, the plate line PL is set to the "high" potential. The signal interconnect BS0 of the block selection transistor BT0 is set to the "high" potential. Then, the difference in potential between the plate line PL and the bit line BL is applied only to the opposite ends of the ferroelectric capacitor C1, connected together in parallel to the memory cell transistor CT1, which has been turned off. Polarization information on the ferroelectric capacitor C1 is read out to the bit line BL. FIG. 2D shows a hysteresis curve of polarization capacity of the ferroelectric capacitor during operation.

Thus, even if the memory cells are connected together in series, selecting an arbitrary word line enables cell information to be read from an arbitrary ferroelectric capacitor. This serves to accomplish perfect random accesses. Further, the plate line can be shared by a plurality of memory cells. The area of the plate line driving circuit can thus be increased, while reducing chip size. Therefore, high-speed operations can be realized.

However, the ferroelectric memory shown in FIG. 1C also has problems described below. As disclosed in Jpn. Pat. Appln. KOKAI Publication No. 11-177036, a ferroelectric memory of a folded bit line configuration can be actualized by providing two types of signal interconnects (gate lines) for each of two bit lines (/BL and BL) constituting a bit line pair and further providing two types of plate lines. This ferroelectric memory is shown in FIGS. 3A and 3B.

In FIG. 3A, four memory cells connected together in series (hereinafter referred to as a "memory cell block") are arranged in each of the upper left and lower left of the circuit. The plate line PL0 is connected to the left end of upper memory cell block. The bit line/BL is connected to the right end of this memory cell block via the block selection transistor BT0, having the signal interconnect BS0 as a gate. Further, the plate line PL1 is connected to the left end of the lower memory cell block. The bit line BL is connected to the right end of this memory cell block via a block selection transistor BT1, having a signal interconnect BS1 as a gate.

For example, to select one memory cell of the upper memory cell block, only the plate line PL0 and the signal interconnect BS0 are set to the "high" potential, with the plate line PL1 and the signal interconnect BS1 remaining at the "low" potential. Cell data is thus read out only to the bit line/BL. The folded bit line configuration can then be realized by causing a sense amplifier SA to amplify the read signal using the bit line BL as a reference bit line.

In this case, because of the arrangement of the memory cell blocks, the signal interconnect BS1 must pass between the upper memory cell blocks. The signal interconnect BS0 must pass between the lower memory cell blocks. It is thus necessary to provide a bridge line BR11 composed of a metal interconnect and striding the signal interconnect BS1 and a bridge line BR12 composed of a metal interconnect and striding the signal interconnect BS0.

Further, in FIG. 3A, the memory cell blocks arranged in the upper right and lower right of the circuit have a similar configuration as shown in the figure. A contact C1 that connects the block selection transistor to the bit line is shared. A ferroelectric memory with this configuration has problems described below.

First, the bit lines have a large capacity. Even if the block selection transistor is turned off at the connection point between itself and the bit line, the capacity of two diffusion layers is connected to the bit line as shown by AA in the figure. This applies to all non-selected memory cell blocks and contributes to increasing the bit line capacity. The diffusion layers connected to the bit line include a diffusion layer AA located below the bit line contact C1 and a diffusion layer AA corresponding to the connection point between the bridge line of the metal interconnect and the block selection transistor.

Second, the block selection transistor has a large transistor area. This is because a large number of contacts are formed in the transistor area of the block selection transistor. For example, the upper two memory cell blocks require three contacts: a contact C1 connected to the bit line/BL, a contact C1 for the left memory cell block which connects the bridge line BR11 and the block selection transistor BT0 together, and a contact C1 for the right memory cell block which connects a block selection transistor BT0' and the bridge line BR12 together. The contacts C1 are required for the block selection transistor. Contacts C2 are essentially required to connect a cell transistor and a cell capacitor together.

In FIG. 3B, the memory cell block is arranged in each of the upper left and lower left of circuit. The plate line PL0 is connected to the left end of the upper memory cell block. The bit line/BL is connected to the right end of this memory cell block via the block selection transistor BT0, having the signal interconnect BS0 as a gate. Further, the plate line PL1 is connected to the left end of the lower memory cell block. The bit line BL is connected to the right end of this memory cell block via the block selection transistor BT1, having the signal interconnect BS1 as a gate.

For example, to select one memory cell of the upper memory cell block, only the plate line PL0 and the signal interconnect BS0 are set to the "high" potential, with the plate line PL1 and the signal interconnect BS1 remaining at the "low" potential. Cell data is thus read out only to the bit line/BL. The folded bit line configuration can then be realized by causing the sense amplifier SA to amplify the read signal using the bit line BL as a reference bit line.

In this case, because of the arrangement of the memory cell blocks, the signal interconnect BS1 must pass between the upper memory cell blocks. The signal interconnect BS0 must pass between the lower memory cell blocks. A depression type transistor is thus used to avoid affecting the signal potential at a possible unwanted intersection of the signal interconnects BS0 and BS1.

Further, in FIG. 3B, the memory cell blocks arranged in the upper right and lower right of the circuit have a similar configuration as shown in the figure. The contact C1 that connects the block selection transistor to the bit line is shared. A ferroelectric memory with this configuration has problems described below.

First, the bit lines have a large capacity. Even if the block selection transistor is turned off at the connection point between itself and the bit line, the depression type transistor remains on. The capacity of this transistor is visible as viewed from the bit line. Furthermore, the capacity of two diffusion layers is connected to the bit line as shown by AA in the figure. This applies to all non-selected memory cell blocks and contributes to drastically increasing the bit line capacity. The diffusion layers connected to the bit line include a diffusion layer AA located below the bit line contact C1 and a diffusion layer AA corresponding to the connection point between the depression type transistor and the block selection transistor.

Second, the block selection transistor has a large transistor area. This is because it is necessary to switch, for each transistor, from ion implantation conditions required to form a channel of the depression type to those required to form a channel of an enhanced type or vice versa, thus hindering the reduction of size of the block selection transistor.

Further, if the upper left memory cell block is to be selected by setting the potential across the signal interconnect BS0 to the "high" value, coupling causes the potential across the bit line BL to decrease because the signal interconnect BS0 is connected to the lower depression type transistor. On the other hand, if the lower left memory cell block is to be selected by setting the potential across the signal interconnect BS1 to the "high" value, coupling occurs because the signal interconnect BS1 is connected to the upper depression type transistor. However, since the block selection transistor BT0, connected to the upper signal interconnect BS0, is off, the potential across the bit line/BL does not increase. Thus, signals are unbalanced between the pair of bit lines.

As described above, even the ferroelectric memory according to the previous applications, which allows the memory cell size to be reduced, has problems described below. (1) The use of a large number of contacts increases the size of the memory cell blocks. (2) An ion ejection area used to form channels is divided into small areas. This contributes to increasing the memory cell block size. (3) A large number of diffusion layers are connected to non-selected blocks. This contributes to increasing the capacity of the bit lines and reducing the magnitude of a read signal. (4) If depression type transistors are used, their channel capacity appears as a bit line capacity even in non-selected blocks. This contributes to increasing the bit line capacity and reducing the magnitude of a read signal. (5) If depression type transistors are used, signals are unbalanced between the pair of bit lines.

BRIEF SUMMARY OF THE INVENTION

According to an aspect of the present invention, there is provided a semiconductor storage device comprising a first memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively; a first block selection transistor which selects the first memory cell block; a first metal interconnect connected between one end of the first memory cell block and one end of a current path in the first block selection transistor; a first bit line connected to the other end of the current path in the first block selection transistor; a second bit line arranged adjacent to the first bit line; and second and third block selection transistors each having a current path one end of which is connected to the second bit line, wherein interconnects connected to gate electrodes of the second and third block selection transistors are disposed below the first metal interconnect.

BRIEF DESCRIPTION OF THE SEVERAL VIEWS OF THE DRAWING

FIG. 4 is a circuit diagram showing a configuration of a ferroelectric memory according to a first embodiment of the present invention;

FIGS. 5A and 5B are sectional views showing the structure of a block selection transistor section and a bridge line section in the ferroelectric memory according to the first embodiment;

FIG. 12 is a layout showing the configuration of the ferroelectric memory according to the third embodiment; and FIG. 13 is a second layout showing the configuration of the ferroelectric memory according to the third embodiment.

DETAILED DESCRIPTION OF THE INVENTION

Figure 1A:
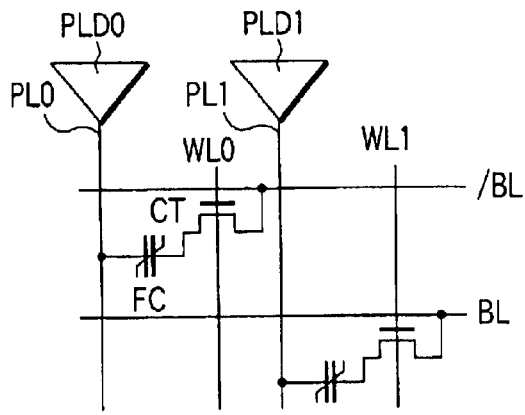
FIG. 1A is a circuit diagram showing a configuration of a memory cell array in a conventional first ferroelectric memory.
Figure 1B:
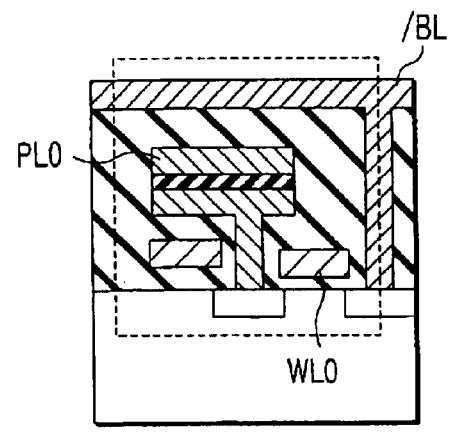
FIG. 1B is a sectional view of a part of the memory cell array in the first ferroelectric memory.
Figure 1C:
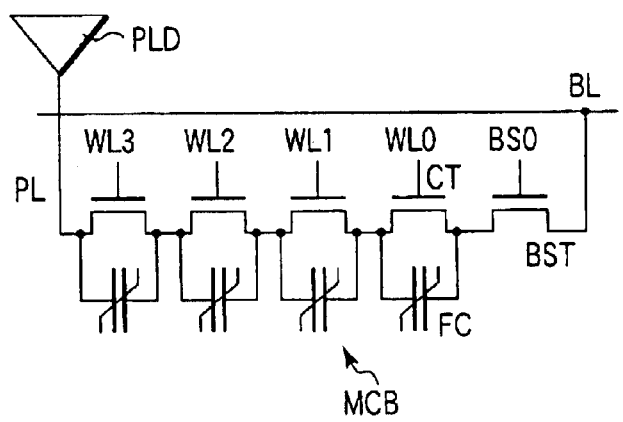
FIG. 1C is a circuit diagram showing a configuration of a memory cell block in a conventional second ferroelectric memory.
Figure 1D:
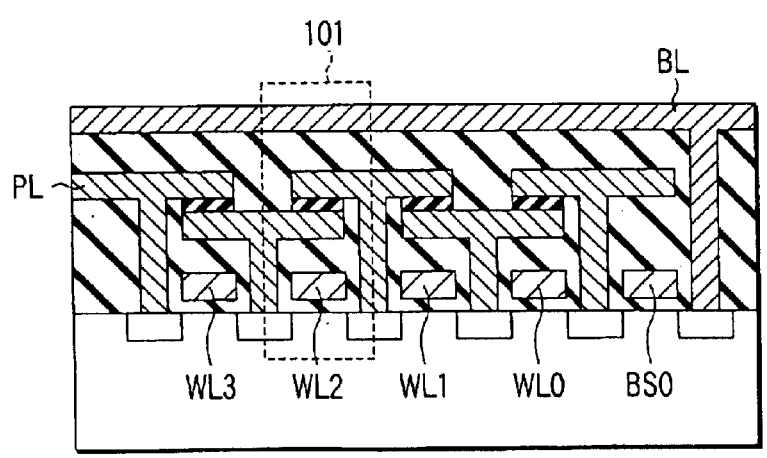
FIG. 1D is a sectional view of the memory cell block in the conventional second ferroelectric memory.
Figure 2A:
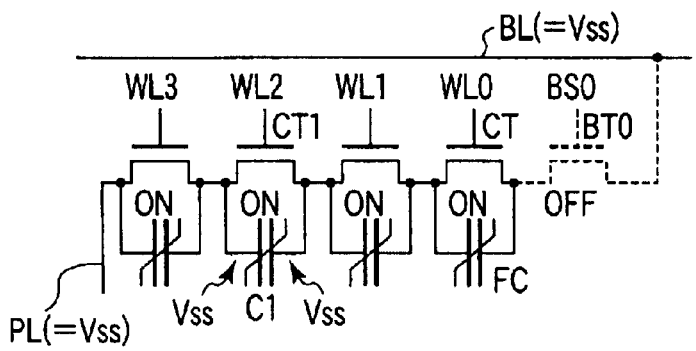
FIG. 2A is a circuit diagram showing an example of the memory cell block in the second ferroelectric memory during standby.
Figure 2B:
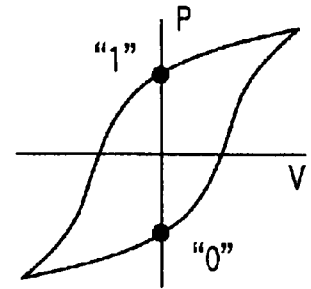
FIG. 2B is a graph showing a hysteresis curve for the polarization capacity of a ferroelectric capacitor during standby.
Figure 2C:
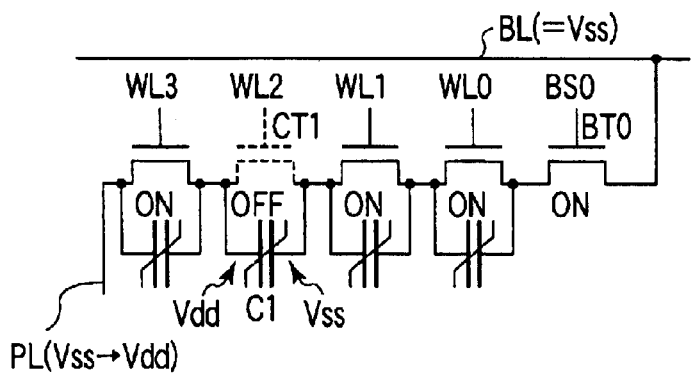
FIG. 2C is a circuit diagram showing an example of the memory cell block in the second ferroelectric memory during operation.
Figure 2D:
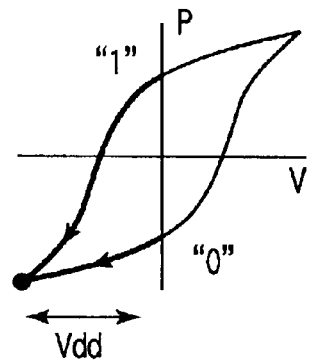
FIG. 2D is a graph showing a hysteresis curve for the polarization capacity of a ferroelectric capacitor during operation.

With reference to the drawings, description will be given to semiconductor storage devices according to embodiments of the present invention. In the description, common parts are denoted by common reference numerals throughout drawings.

First Embodiment

First, description will be given of a ferroelectric memory according to a first embodiment.

FIG. 4 is a circuit diagram showing a configuration of the ferroelectric memory according to the first embodiment.

Figure 3A:
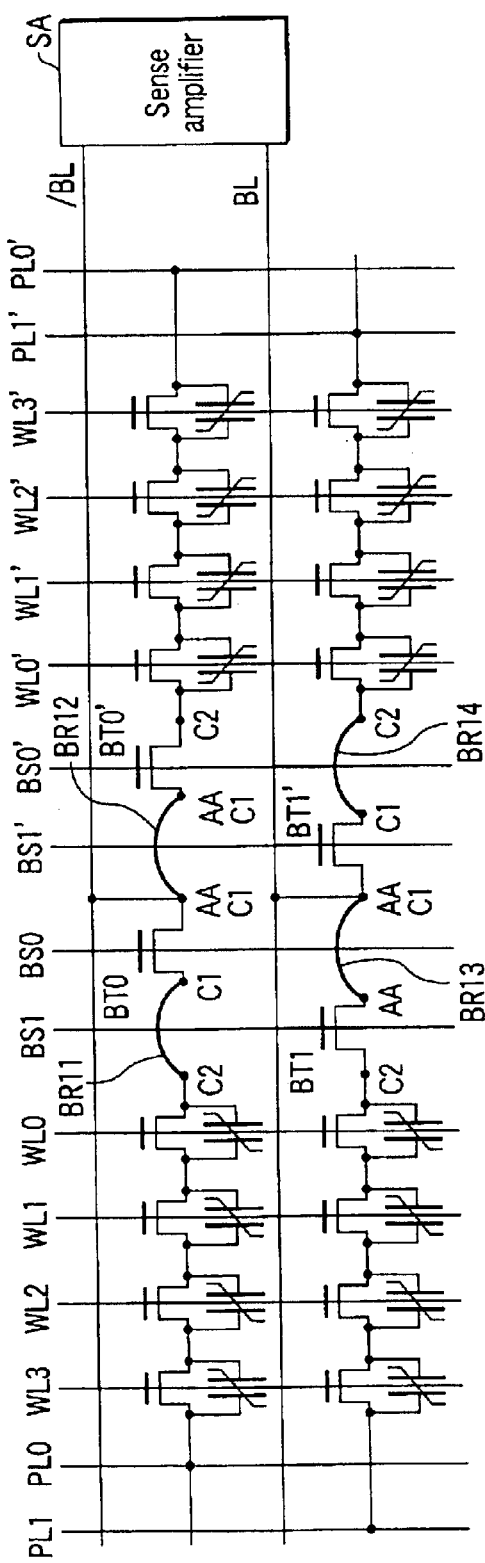
FIGS. 3A and 3B are circuit diagrams showing a configuration of a memory cell array in a conventional third ferroelectric memory.

The configuration shown in the first embodiment enables the memory block size and the capacity of the bit lines to be reduced compared to the ferroelectric memory shown in FIG. 3A.

As shown in FIG. 4, one memory cell is composed of a cell transistor CT and a ferroelectric memory FC connected together in parallel. That is, an electrode at one end of the ferroelectric memory FC is connected to one end of a current path in the cell transistor CT. An electrode at the other end of the ferroelectric memory FC is connected to the other end of the current path in the cell transistor CT.

One memory cell block is constructed by connecting a plurality of memory cells of the parallel configuration together so that the current paths in the cell transistors CT are connected together in series. In this case, an example is shown in which four memory cells are connected together in series. A bit line /BL is connected via a bridge line BR0 and a block selection transistor BT0 to one end of a memory cell block MCBT0 having four memory cells connected together in series. A sense amplifier SA is connected to the bit line/BL. A plate line PL0 is connected to the memory cell block MCB0.

The major difference of this embodiment from the configuration shown in FIG. 3A is the configuration and arrangement of a block selection transistor section.

Here, to simplify the description, an example will be shown in which memory cell blocks MCB0, MCB0', MCB1, and MCB1' are arranged in the upper left and right and lower left and right of the circuit, respectively, as shown in FIG. 4.

In the configuration shown in FIG. 3A, the contacts with the bit lines constitute turning points between the two left memory cell blocks MCB0 and MCB1 and the two right memory cell blocks MCB0' and MCB1', respectively. That is, block selection transistors BT0 and BT1 for the left memory cell blocks MCB0 and MCB1, respectively, are arranged to the left of a bit line contact C1 section. Block selection transistors BT0' and BT1' for the left memory cell blocks MCB0' and MCB1', respectively, are arranged to the right of the bit line contact C1 section.

However, in the first embodiment, as shown in FIG. 4, the block selection transistors BT0 and BT0' for the upper left and right memory cell blocks MCB0 and MCB0', respectively, are arranged to the right of signal interconnects (gate lines) BS1 and BS1'. The block selection transistors BT1 and BT1' for the lower left and right memory cell blocks MCB1 and MCB1', respectively, are arranged to the left of signal interconnects (gate lines) BS0 and BS0'. Thus, the signal interconnects (gate lines) BS1 and BS1' for the lower left and right block selection transistors BT1 and BT1', respectively, pass through the left of the two upper block selection transistors BT0 and BT0'. The signal interconnects (gate lines) BS0 and BS0' for the upper left and right block selection transistors BT0 and BT0', respectively, pass through the right of the two lower block selection transistors BT1 and BT1'. Furthermore, the two passing signal lines BS1 and BS1' are arranged adjacent to each other. The signal lines BS0 and BS0' are also arranged adjacent to each other.

That is, the two signal interconnects BS1 and BS1', arranged adjacent to each other, are not arranged between the bit line contact C1 and the block selection transistor BT0 or BT0'. However, these signal interconnects are arranged between the block selection transistor BT0 and the memory cell block MCB0. Further, the two signal interconnects BS0 and BS0', arranged adjacent to each other, are not arranged between the bit line contact C1 and the block selection transistor BT1 or BT1'. However, these signal interconnects are arranged between the block selection transistor BT1' and the memory cell block MCB1'.

Furthermore, as shown in FIG. 4, a bridge line BR0 is formed of a metal interconnect between the memory cell block MCB0 and the block selection transistor BT0. Then, the bridge line BR0 is made to stride the signal interconnects BS1 and BS1' of the block selection transistors BT1 and BT1', respectively. A bridge line BR1 is formed of a metal interconnect between the memory cell block MCB1' and the block selection transistor BT1'. Then, the bridge line BR1 is made to stride the signal interconnects BS0 and BS0' of the block selection transistors BT0 and BT0', respectively. The bridge lines BR0 and BR1 are formed of, for example, aluminum interconnects.

The configuration shown in FIG. 3A requires the two bridge lines BR11 and BR12, made of metal interconnects, for the upper left and right block selection transistor section. However, in the first embodiment, the passing signal interconnects BS1 and BS1' are concentrated in one area. Accordingly, only one bridge line BR0, made of a metal interconnect, is required. Likewise, the configuration shown in FIG. 3A requires two bridge lines BR13 and BR14, made of metal interconnects, for the lower left and right block selection transistor section. However, in the first embodiment, the passing signal interconnects BS0 and BS0' are concentrated in one area. Accordingly, only one bridge line BR1, made of a metal interconnect, is required.

In FIG. 4, the contact C1 is required by the block selection transistor section. A contact 2 is essentially required by a memory cell section. The bridge lines BR0 and BR1 indicate jumper lines composed of metal interconnects. A connection point AA indicates a diffusion layer that appears as a capacity as viewed from the bit line even through it is connected to a non-selected memory cell block.

In the first embodiment, in the area in which the block selection transistor is formed, there are two contacts: a contact C1 for a connection to the bit line /BL (or BL) and a contact C1 for a connection to the bridge BR0 (BR1) via the block selection transistor BT0 (or BT1'). The configuration shown in FIG. 3A requires three contacts C1. Accordingly, in the first embodiment, the number of contacts C1 required can be reduced from three to two.

Thus, in the first embodiment, the same design rule can be used to reduce the block size composed of four memory cell blocks, compared to the configuration shown in FIG. 3A.

Further, the block selection transistors that are turned off when not selected are connected directly to the respective ends of the contact C1, connected to the bit line. It is thus possible to reduce the number of diffusion layers AA connected to the non-selected memory cell block, from two to one. This serves to reduce the capacity of the bit line/BL (or BL). It is thus possible to increase the magnitude of a read signal read from the memory cell during a read.

Now, description will be given of the sectional structure of the block selection transistor section and bridge line section in the ferroelectric memory shown in FIG. 4, the bridge line section comprising a metal interconnect.

FIGS. 5A and 5B are sectional views showing the structures of the block selection transistor section and bridge line section in the ferroelectric memory according to the first embodiment.

FIG. 5A show a cross section between the upper memory cell blocks MCB0 and MCB0', shown in FIG. 4, i.e., a cross section of the block selection transistor BT0 and BT0' section and the bridge line BR0 section.

As shown in FIG. 5A, an element separating and insulating film 12 and diffusion layers AA, 13A, 13B, and 13C are formed in a semiconductor substrate 11. The signal interconnects BS1 and BS1' are formed above the element separating and insulating film 12 via an insulating film. The bridge line BR0, composed of a metal interconnect, is formed above the signal interconnects BS1 and BS1'. The contact C2 is formed between the diffusion layer 13A and the bridge BR0. The contact C1 is formed between the diffusion layer 13B and the bridge BR0.

Further, the bit line/BL is formed above the bridge BR0 via an insulating film. The contact C1 is formed between the diffusion layer AA and the bit line /BL. The signal interconnect (gate line) BS0 is formed above the semiconductor substrate 11 and between the diffusion layers AA and 13B via a gate insulating film. Furthermore, the signal interconnect (gate line) BS0' is formed above the semiconductor substrate 11 and between the diffusion layers AA and 13C via a gate insulating film.

Moreover, one end of the memory cell block MCB0' is formed above the diffusion layer 13C via an insulating film. The contact C2 is formed between the diffusion layer 13C and the one end of the memory cell block MCB0'.

With this structure, the bridge line BR0, composed of a metal interconnect, is formed to stride the two signal interconnects BS1 and BS1' of the block selection transistors BT1 and BT1', respectively, as previously described.

Next, description will be given of the structures of the lower block selection transistor section and bridge line section.

FIG. 5B show a cross section between the lower memory cell blocks MCB1 and MCB1', shown in FIG. 4, i.e., a cross section of the block selection transistor BT1 and BT1' section and the bridge line BR1 section.

As shown in FIG. 5B, the element separating and insulating film 12 and the diffusion layers AA, 13A, 13B, and 13C are formed in the semiconductor substrate 11. The signal interconnects BS0 and BS0' are formed above the element separating and insulating film 12 via an insulating film. The bridge line BR1, composed of a metal interconnect, is formed above the signal interconnects BS0 and BS0'. The contact C2 is formed between the diffusion layer 13A and the bridge BR1. The contact C1 is formed between the diffusion layer 13B and the bridge BR1.

Further, the bit line BL is formed above the bridge BR1 via an insulating film. The contact C1 is formed between the diffusion layer AA and the bit line BL. The signal interconnect (gate line) BS1' is formed above the semiconductor substrate 11 and between the diffusion layers AA and 13B via a gate insulating film. Furthermore, the signal interconnect (gate line) BS1 is formed above the semiconductor substrate 11 and between the diffusion layers AA and 13C via a gate insulating film.

Moreover, one end of the memory cell block MCB1 is formed above the diffusion layer 13C via an insulating film. The contact C2 is formed between the diffusion layer 13C and the one end of the memory cell block MCB1.

With this structure, the bridge line BR1, composed of a metal interconnect, is formed to stride the two signal interconnects BS1 and BS1' of the block selection transistors BT1 and BT1', respectively, as previously described.

Now, description will be given of a layout of the block selection transistor section and bridge line section in the ferroelectric memory shown in FIG. 4.

Figure 6:
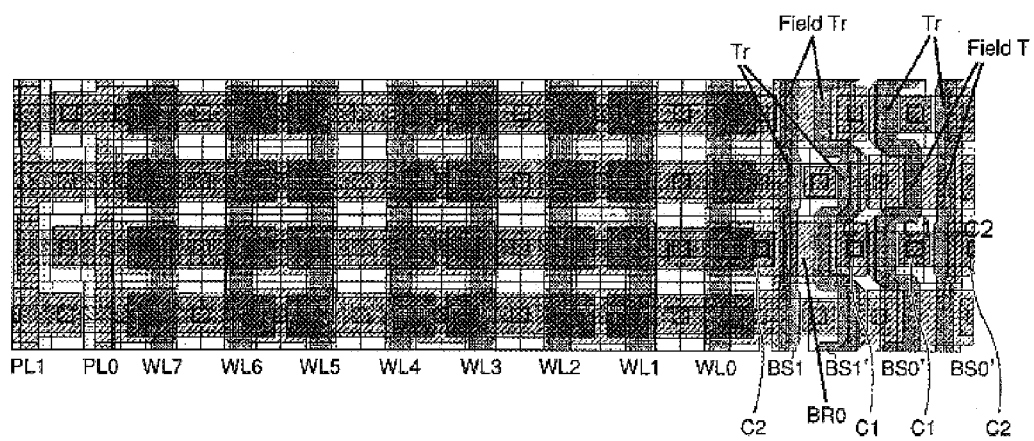
FIG. 6 is a layout showing the configuration of the ferroelectric memory according to the first embodiment.

FIG. 6 is a layout showing the configuration of the ferroelectric memory according to the first embodiment. Here, an example will be shown in which a lower electrode of a ferroelectric capacitor is used as the bridge line BR0, composed of a metal interconnect.

As shown in FIG. 6, the signal interconnects BS1 an BS1' are arranged between the contact C2 and the contact C1. The bridge BR0, which connects the contacts C2 and C1 together, is formed above the signal interconnects BS1 and BS1'. The bridge BR0 is formed of a conductor pattern used to form the lower electrode of the ferroelectric capacitor. It is formed of a metal interconnect present in the same layer as that of the lower electrode, or the like.

As described above, in the first embodiment, between the memory cell blocks, the signal interconnects (gate lines) BS1 and BS1' (or BS0 and BS0') of the block selection transistors passing between the memory cell blocks are arranged adjacent to each other. Then, the existing interconnecting pattern is formed so as to stride the two signal interconnects. This serves to reduce the formation area of the block selection transistor required between the memory cell blocks and the signal interconnects for this transistor. Furthermore, it is possible to reduce the capacity formed in the bit line.

Second Embodiment

Next, description will be given of a ferroelectric memory according to a second embodiment of the present invention. In the second embodiment, an example will be shown in which a metal interconnect formed above the upper electrode of the ferroelectric memory is utilized as the bridge BR0, composed of a metal interconnect. In the second embodiment, parts similar to those in the configuration according to the first embodiment are denoted by the same reference numerals. Their description is omitted. Only different components will be described.

Figure 7:
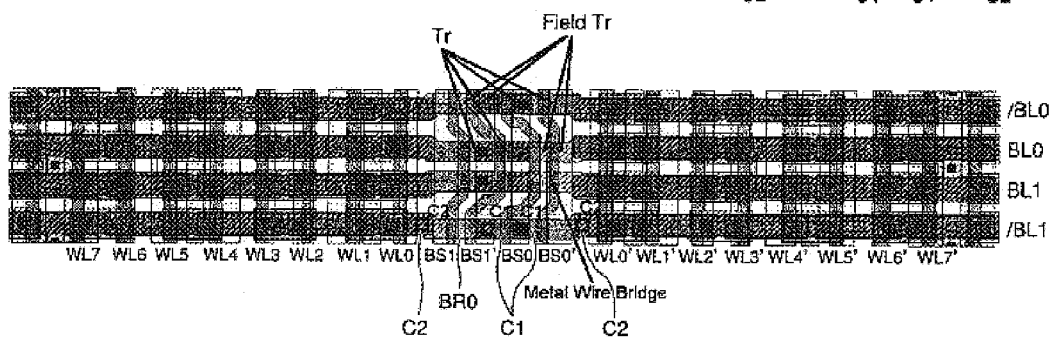
FIG. 7 is a layout showing a configuration of a ferroelectric memory according to a second embodiment of the present invention.
Figure 8:
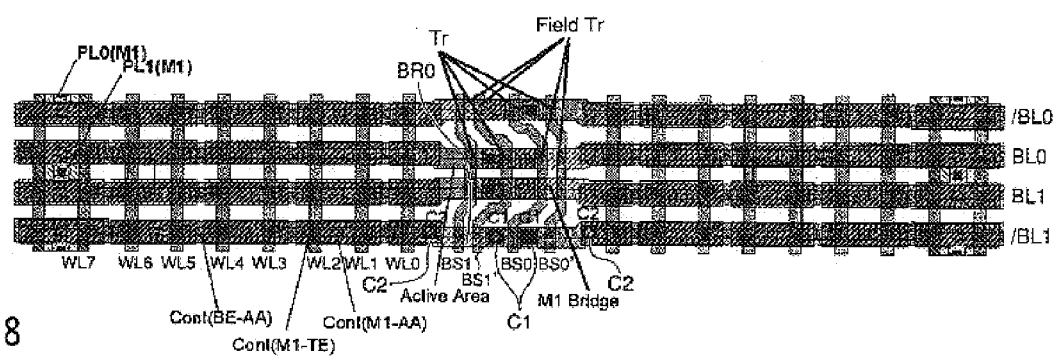
FIG. 8 is a second layout showing the configuration of the ferroelectric memory according to the second embodiment.
Figure 9:
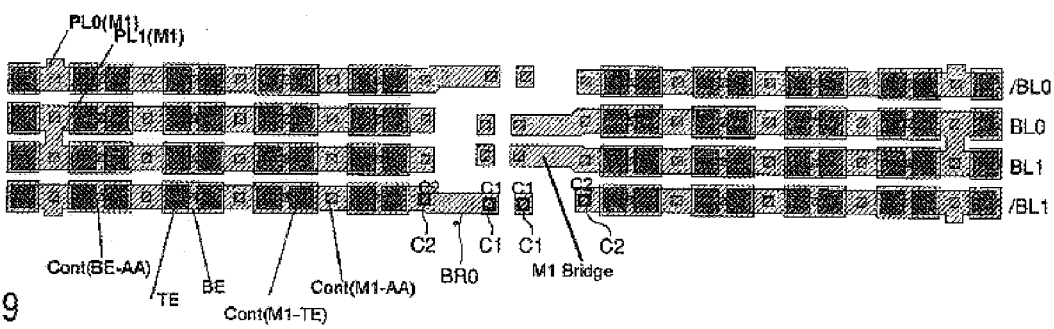
FIG. 9 is a third layout showing the configuration of the ferroelectric memory according to the second embodiment.

FIGS. 7, 8, and 9 are layouts showing configurations of the ferroelectric memory according to the second embodiment.

As shown in FIGS. 7 to 9, the signal interconnects BS1 and BS1' are arranged between the contacts C2 and C1. The bridge line BR0, composed of a first metal interconnect and connecting the contacts C2 and C1 together, is formed above the signal interconnects BS1 and BS1'. The bridge BR0 is formed of a metal interconnect pattern used above the upper electrode of the ferroelectric capacitor. The other arrangements and effects are similar to those of the first embodiment, previously described.

As described above, in the second embodiment, between the memory cell blocks, the signal interconnects (gate lines) BS1 and BS1' (or BS0 and BS0') of the block selection transistors passing between the memory cell blocks are arranged adjacent to each other. Then, a metal interconnecting pattern used above the upper electrode of the ferroelectric capacitor is formed so as to stride the two signal interconnects. This serves to reduce the formation area of the block selection transistor required between the memory cell blocks and the signal interconnects for this transistor. Furthermore, it is possible to reduce the capacity formed in the bit line.

Third Embodiment

Next, description will be given of a ferroelectric memory according to a third embodiment of the present invention. In the third embodiment, an example will be shown in which instead of the bridge lines BR0 and BR1 in the first embodiment, composed of metal interconnects, a depression type transistor is used to pass the signal interconnects between the memory cell blocks. In the third embodiment, parts similar to those in the configuration according to the first embodiment are denoted by the same reference numerals. Their description is omitted. Only different components will be described.

Figure 10:
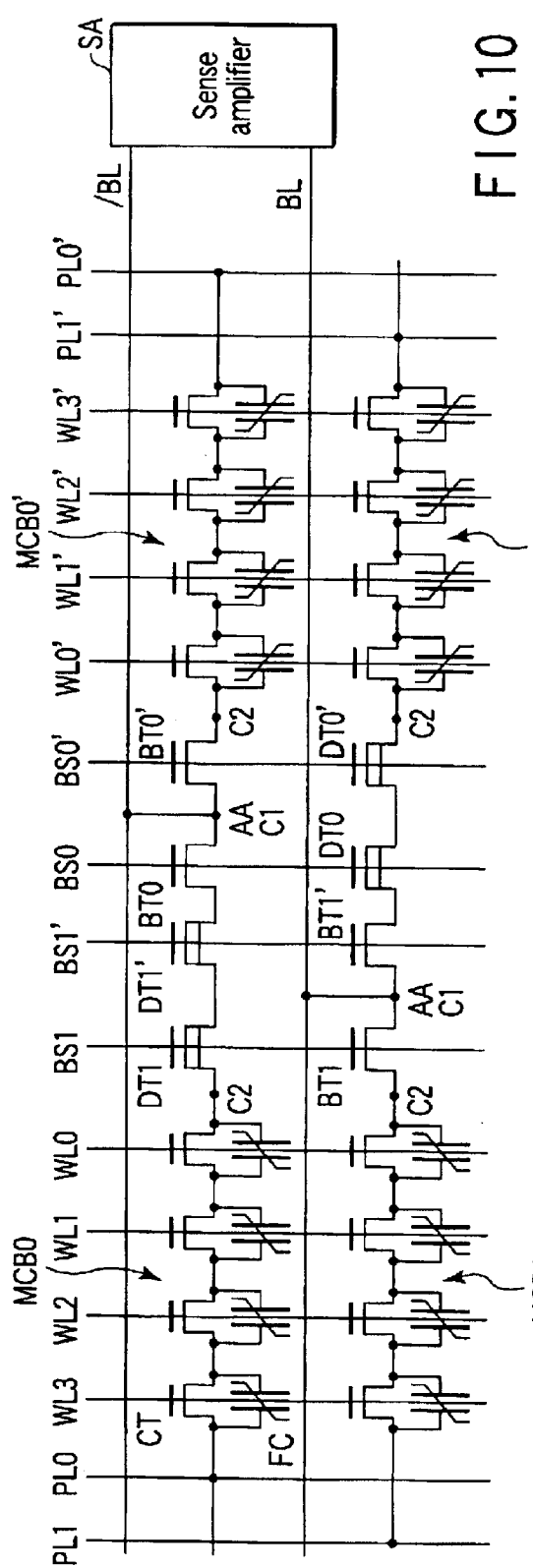
FIG. 10 is a circuit diagram showing a configuration of a ferroelectric memory according to a third embodiment of the present invention.

FIG. 10 is a circuit diagram showing a configuration of a ferroelectric memory according to the third embodiment.

In the third embodiment, as shown in FIG. 10, the block selection transistors BT0 and BT0' for the upper left and right memory cell blocks MCB0 and MCB0', respectively, are arranged to the right of signal interconnects (gate lines) BS1 and BS1'. The block selection transistors BT1 and BT1' for the lower left and right memory cell blocks MCB1 and MCB1', respectively, are arranged to the left of signal interconnects (gate lines) BS0 and BS0'. Thus, the signal interconnects (gate lines) BS1 and BS1' for the lower left and right block selection transistors BT1 and BT1', respectively, pass through the left of the two upper block selection transistors BT0 and BT0'. The signal interconnects (gate lines) BS0 and BS0' for the upper left and right block selection transistors BT0 and BT0', respectively, pass through the right of the two lower block selection transistors BT1 and BT1'. Furthermore, the two passing signal lines BS1 and BS1' are arranged adjacent to each other. The signal lines BS0 and BS0' are also arranged adjacent to each other.

That is, the two signal interconnects BS1 and BS1', arranged adjacent to each other, are not arranged between the bit line contact C1 and the block selection transistor BT0 or BT0'. However, these signal interconnects are arranged between the block selection transistor BT0 and the memory cell block MCB0. Further, the two signal interconnects BS0 and BS0', arranged adjacent to each other, are not arranged between the bit line contact C1 and the block selection transistor BT1 or BT1'. However, these signal interconnects are arranged between the block selection transistor BT1' and the memory cell block MCB1'.

Furthermore, as shown in FIG. 10, depression type transistors (the transistors in the figure the transistor marks of which are painted over) DT1 and DT1' are formed between the memory cell block MCB0 and the block selection transistor BT0. Then, a gate line of the transistor DT1 is set as the signal interconnect BS1. A gate line of the transistor DT1' is set as the signal interconnect BS1'. Further, depression type transistors DT0 and DT0' are formed between the memory cell block MCB1' and the block selection transistor BT1'. Then, a gate line of the transistor DT0 is set as the signal interconnect BS0. A gate line of the transistor DT0' is set as the signal interconnect BS0'.

Figure 3B:
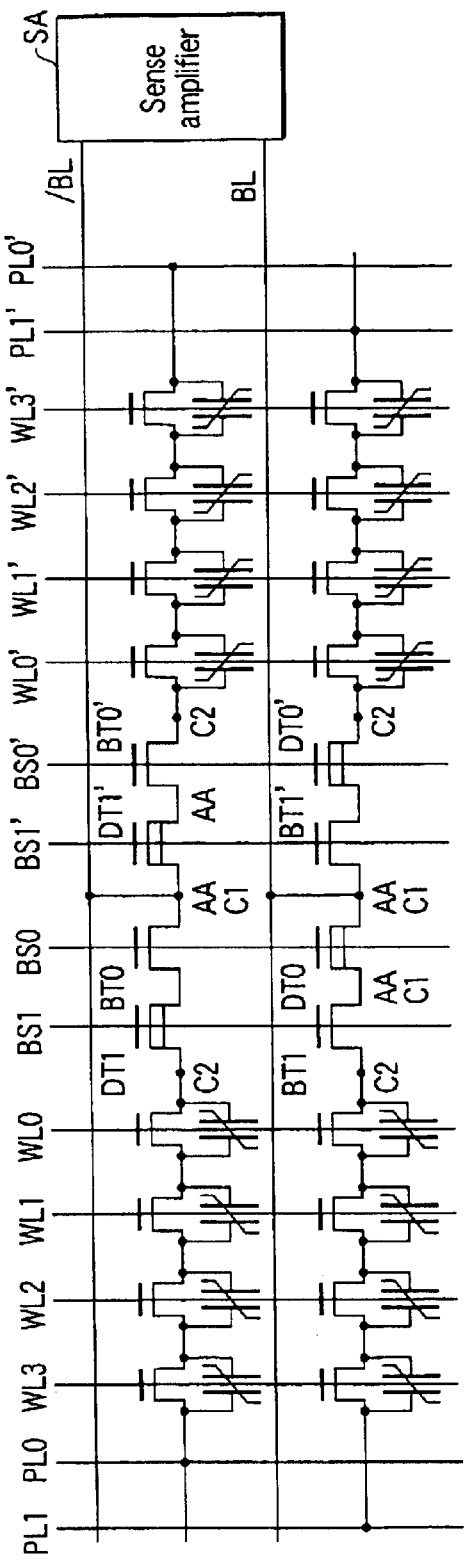

In the configuration shown in FIG. 3B, the depression type transistors are separated from each other so as to belong to the upper left and right block selection transistor sections, respectively. In the third embodiment, however, the passing signal interconnects BS1 and BS1' are concentrated in one area to allow the depression type transistors to be arranged adjacent to each other. This requires only one ion implantation area used to form channels of the depression type transistors.

Likewise, in the configuration shown in FIG. 3B, the depression type transistors are separated from each other so as to belong to the lower left and right block selection transistor sections, respectively. In the third embodiment, however, the passing signal interconnects BS0 and BS0' are concentrated in one area to allow the depression type transistors to be arranged adjacent to each other. This requires only one ion implantation area used to form channels of the depression type transistors.

As a result, in the third embodiment, the same design rule can be used to reduce the block size composed of four memory cell blocks compared to the configuration shown in FIG. 3B.

Further, in FIG. 10, the contact C1 is required by the block selection transistor section. The contact 2 is essentially required by the memory cell section. The connection point AA indicates a diffusion layer that appears as a capacity as viewed from the bit line even though it is connected to a non-selected memory cell block.

In the third embodiment, one diffusion layer AA appears as a capacity as viewed from the bit line. In the configuration shown in FIG. 3B, two diffusion layers AA appear as capacities as viewed from the bit line. Consequently, in the third embodiment, it is possible to reduce the number of diffusion layers appearing as capacities as viewed from the bit line, from two to one.

Furthermore, the block selection transistors that are turned off when not selected are connected directly to the respective ends of the contact C1, connected to the bit line. It is thus possible to reduce the number of diffusion layers AA connected to the non-selected memory cell block, from two to one. This serves to reduce the capacity of the bit line/BL (or BL). It is thus possible to increase the magnitude of a read signal read from the memory cell during a read.

Now, description will be given of the sectional structure of the block selection transistor section and bridge line section in the ferroelectric memory shown in FIG. 10, the bridge line section comprising a metal interconnect.

Figure 11B:
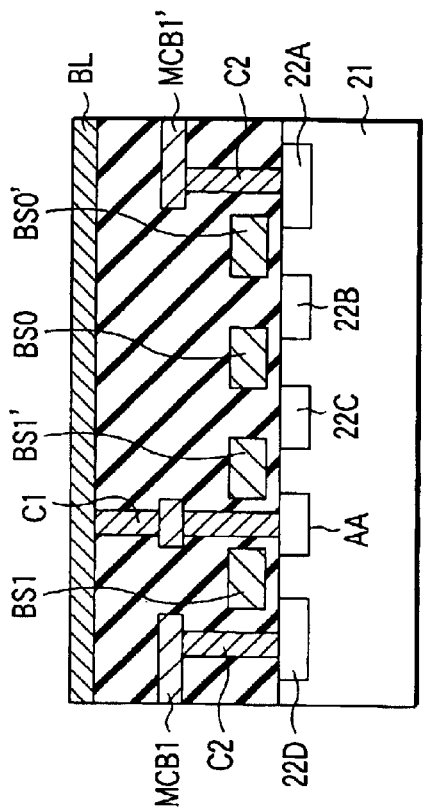
FIGS. 11A and 11B are sectional views showing the structures of a block selection transistor section and a depression type transistor section in the ferroelectric memory according to the third embodiment.
Figure 11A:
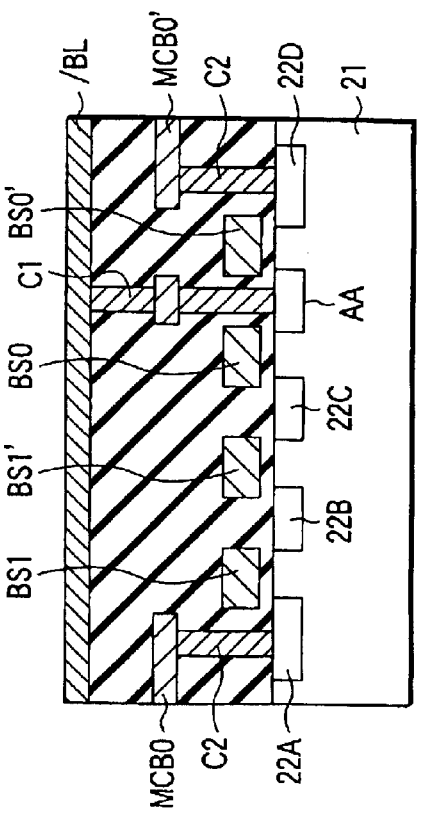

FIGS. 11A and 11B are sectional views showing the structures of the block selection transistor section and depression type transistor line section in the ferroelectric memory according to the third embodiment.

FIG. 11A shows a cross section between the upper memory cell blocks MCB0 and MCB0', shown in FIG. 10, i.e., a cross section of the block selection transistor BT0 and BT0' section and the depression type transistor DT1 and DT1' section.

As shown in FIG. 11A, diffusion layers AA, 22A, 22B, 22C, and 22D are formed in a semiconductor substrate 21. The signal interconnect (gate line) BS1 is formed above the semiconductor substrate 21 and between the diffusion layers 22B and 22C via a gate insulating film. The signal interconnect (gate line) BS1' is formed above the semiconductor substrate 21 and between the diffusion layers 22C and AA via a gate insulating film. The signal interconnect (gate line) BS0 is formed above the semiconductor substrate 21 and between the diffusion layers 22C and AA via a gate insulating film. The signal interconnect (gate line) BS0' is formed above the semiconductor substrate 21 and between the diffusion layers AA and 22D via a gate insulating film.

Furthermore, one end of the memory cell block MCB0 is formed above the diffusion layer 22A via an insulating film. The contact C2 is formed between the diffusion layer 22A and the one end of the memory cell block MCB0. Further, one end of the memory cell block MCB0' is formed above the diffusion layer 22D via an insulating film. The contact C2 is formed between the diffusion layer 22D and the one end of the memory cell block MCB0'.

Moreover, the bit line/BL is formed above the previously described signal interconnects and above the one end of each of the memory cell blocks MCB0 and MCB0'. The contact C1 is formed between the diffusion layer 22A and the bit line/BL.

With this structure, the two signal interconnects BS1 and BS1' of the block selection transistors BT1 and BT1', respectively, are formed as gate lines of the depression type transistors DT1 and DT1', respectively.

Now, description will be given of the structures of the lower block selection transistor section and the depression type transistor section.

FIG. 11B shows a cross section between the upper memory cell blocks MCB1 and MCB1', shown in FIG. 10, or a cross section of the block selection transistor BT1 and BT1' section and the depression type transistor DT0 and DT0' section.

As shown in FIG. 11B, the diffusion layers AA, 22A, 22B, 22C, and 22D are formed in the semiconductor substrate 21. The signal interconnect (gate line) BS0' is formed above the semiconductor substrate 21 and between the diffusion layers 22A and 22B via a gate insulating film. The signal interconnect (gate line) BS0 is formed above the semiconductor substrate 21 and between the diffusion layers 22B and 22C via a gate insulating film. The signal interconnect (gate line) BS1' is formed above the semiconductor substrate 21 and between the diffusion layers 22C and AA via a gate insulating film. The signal interconnect (gate line) BS1 is formed above the semiconductor substrate 21 and between the diffusion layers AA and 22D via a gate insulating film.

Furthermore, one end of the memory cell block MCB1' is formed above the diffusion layer 22A via an insulating film. The contact C2 is formed between the diffusion layer 22A and the one end of the memory cell block MCB1'. Further, one end of the memory cell block MCB1 is formed above the diffusion layer 22D via an insulating film. The contact C2 is formed between the diffusion layer 22D and the one end of the memory cell block MCB1.

Moreover, the bit line BL is formed above the previously described signal interconnects and above the one end of each of the memory cell blocks MCB1 and MCB1'. The contact C1 is formed between the diffusion layer AA and the bit line BL.

With this structure, the two signal interconnects BS0 and BS0' of the block selection transistors BT0 and BT0', respectively, are formed as gate lines of the depression transistors DT0 and DT0', respectively.

Next, description will be given of layouts of the block selection transistor section and depression type transistor section in the ferroelectric memory shown in FIG. 10.

FIGS. 12 and 13 are layouts showing the configuration of the ferroelectric memory according to the third embodiment. FIG. 13 corresponds to the layout in FIG. 12 from which a part of the interconnecting layer has been removed.

As shown in FIGS. 12 and 13, the signal interconnects (gate lines) BS1 and BS1' of the block selection transistors BT1 and BT1', respectively, are arranged between the contacts C2 and C1. A depression type ion implantation area 31 is formed on the semiconductor substrate and below the signal interconnects (gate lines) BS1 and BS1'.

Further, the signal interconnects (gate lines) BS0 and BS0' of the block selection transistors BT0 and BT0', respectively, are arranged at the respective sides of the contact C1.

As previously described, in the third embodiment, the two depression type transistors are consecutively arranged. Accordingly, the upper and lower block section transistor sections as a whole require only one ion implantation area used to form channels of the depression type transistors. In other words, it is unnecessary to form a large number of small ion implantation areas. Consequently, as in the case with the bridge lines shown in FIG. 4, which are composed of a metal interconnect, the same design rule can be used to reduce the block size composed of four memory cell blocks compared to the configuration shown in FIG. 4.

Furthermore, the block selection transistors that are turned off when not selected are connected directly to the respective ends of the contact C1, connected to the bit line. It is thus possible to reduce the number of diffusion layers AA connected to the non-selected memory cell block, from two to one. This serves to reduce the capacity of the bit line/BL (or BL). It is thus possible to increase the magnitude of a read signal read from the memory cell during a read.

Moreover, the gate capacity of the depression type transistor is invisible as viewed from the bit line (or BL) because it is connected to the bit line via a turned-off block selection transistor. This serves to reduce the capacity of the bit line. It is thus possible to increase the magnitude of a read signal read from the memory cell during a read.

Further, since the depression type transistor is connected to the bit line via a turned-off block selection transistor, the potential across the reference bit line does not vary in spite of a variation in potential at the gate of the depression type transistor. This prevents unbalance between signals on the pair of bit lines.

As described above, in the third embodiment, between the memory cell blocks, the signal interconnects (gate lines) BS1 and BS1' (or BS0 and BS0') of the block selection transistors passing between the memory cell blocks are arranged adjacent to each other. Further, the gate lines of the two depression type transistors are formed as the two signal interconnects. It is thus possible to reduce the area used to form the block selection transistors and their signal interconnects, all of which are required between the memory cell blocks. Furthermore, the capacity formed in the bit line can be reduced.

As described above, according to the embodiments of the present invention, a ferroelectric memory can be provided which enables a reduction in memory cell block size and bit line capacity, as well as an increase in the magnitude of a read signal.

Further, the previously described embodiments can not only be individually implemented, but can also be combined together. Furthermore, each of the previously described embodiments includes inventions at various stages. Any of these inventions can be extracted by properly combining any of the plurality of components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a first memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively;
   a first block selection transistor which selects the first memory cell block;
   a first metal interconnect connected between one end of the first memory cell block and one end of a current path in the first block selection transistor;
   a first bit line connected to the other end of the current path in the first block selection transistor;
   a second bit line arranged adjacent to the first bit line; and
   second and third block selection transistors each having a current path one end of which is connected to the second bit line, wherein interconnects connected to gate electrodes of the second and third block selection transistors are disposed below the first metal interconnect.

2. The semiconductor storage device according to claim 1, further comprising:
   a second memory cell block connected to the other end of the current path in the second block selection transistor; and
   a third memory cell block connected to the other end of the current path in the third block selection transistor.

3. The semiconductor storage device according to claim 1, wherein interconnects connected to the gate electrodes of the second and third block selection transistors via insulating films are arranged below the first metal interconnect.

4. A semiconductor storage device comprising:
a first memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively;
a first block selection transistor which selects the first memory cell block;
a first metal interconnect connected between one end of the first memory cell block and one end of a current path in the first block selection transistor;
a first bit line connected to the other end of the current path in the first block selection transistor;
a second memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the second memory cell block being arranged in a direction in which the first bit line extends, relative to the first memory cell block;
a second block selection transistor having a current path with one end connected to one end of the second memory cell block and with the other end connected to the first bit line;
a third memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the third memory cell block being arranged in a direction perpendicular to the direction in which the first bit line extends, relative to the first memory cell block;
a third block selection transistor having a current path with one end connected to one end of the third memory cell block;
a second bit line connected to the other end of the current path in the third block selection transistor;
a fourth memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the fourth memory cell block being arranged in a direction in which the first bit line extends, relative to the third memory cell block;
a fourth block selection transistor having a current path with one end connected to the second bit line, the fourth block selection transistor selecting the fourth memory cell block; and
a second metal interconnect connected between one end of the fourth memory cell block and the other end of the current path in the fourth block selection transistor;
wherein interconnects connected to gate electrodes of the third and fourth block selection transistors are disposed below the first metal interconnect, and interconnects connected to gate electrodes of the first and second block selection transistors are disposed below the second metal interconnect.

5. The semiconductor storage device according to claim 4, wherein the first and second metal interconnects are formed in the same layer as that of a lower electrode of the ferroelectric capacitor.

6. The semiconductor storage device according to claim 4, wherein the first and second metal interconnects include aluminum interconnects.

7. The semiconductor storage device according to claim 4, wherein the interconnects connected to the gate electrodes of the third and fourth block selection transistors are disposed below the first metal interconnect via an insulating film, and the interconnects connected to the gate electrodes of the first and second block selection transistors are disposed below the second metal interconnect via an insulating film.

8. A semiconductor storage device comprising:
a first memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively;
a first block selection transistor which selects the first memory cell block;
first and second depression type transistors connected together in series between one end of the first memory cell block and one end of a current path in the first block selection transistor;
a first bit line connected to the other end of the current path in the first block selection transistor;
a second memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the second memory cell block being arranged in a direction perpendicular to the direction in which the first bit line extends, relative to the first memory cell block;
a second block selection transistor having a current path with one end connected to one end of the second memory cell block, a gate electrode of the second block selection transistor being connected to a gate electrode of the first depression type transistor; and
a second bit line connected to the other end of the current path in the second block selection transistor and arranged adjacent to the first bit line.

9. The semiconductor storage device according to claim 6, wherein the first and second block selection transistors are of an enhancement type.

10. A semiconductor storage device comprising:
a first memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively;
a first depression type transistor having a current path with one end connected to one end of the first memory cell block, the first depression type transistor having a first signal as a gate input;
a second depression type transistor having a current path with one end connected to the other end of the current path in the first depression type transistor, the second depression type transistor having a second signal as a gate input;

a first block selection transistor having a current path with one end connected to the other end of the current path in the second depression type transistor, the first block selection transistor having a third signal as a gate input;

a first bit line connected to the other end of the current path in the first block selection transistor;

a second memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the second memory cell block being arranged in a direction in which the first bit line extends, relative to the first memory cell block;

a second block selection transistor having a current path with one end connected to one end of the second memory cell block and with the other end connected to the first bit line, the second block selection transistor having a fourth signal as a gate input;

a third memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the third memory cell block being arranged in a direction perpendicular to the direction in which the first bit line extends, relative to the first memory cell block;

a third block selection transistor having a current path with one end connected to one end of the third memory cell block, the third block selection transistor having the first signal as gate input;

a second bit line connected to the other end of the current path in the third block selection transistor;

a fourth memory cell block having a plurality of memory cells connected together in series, each of the memory cells comprising a cell transistor and a ferroelectric capacitor, the ferroelectric capacitor having an electrode at one end and an electrode at the other end which are connected to a source and a drain of the cell transistor, respectively, the fourth memory cell block being arranged in a direction in which the first bit line extends, relative to the third memory cell block;

a third depression type transistor having a current path with one end connected to one end of the fourth memory cell block, the third depression type transistor having the fourth signal as a gate input;

a fourth depression type transistor having a current path with one end connected to the other end of the current path in the third depression type transistor, the fourth depression type transistor having the third signal as a gate input; and a fourth block selection transistor having a current path with one end connected to the other end of the current path in the fourth depression type transistor and with the other end connected to the second bit line, the fourth block selection transistor having the second signal as a gate input.

11. The semiconductor storage device according to claim 10, wherein the first, second, third, and fourth block selection transistors are of an enhancement type.

12. The semiconductor storage device according to claim 10, wherein the gate electrode of the first depression type transistor is connected to the gate electrode of the third block selection transistor, the gate electrode of the second depression type transistor is connected to the gate electrode of the fourth block selection transistor, the gate electrode of the third depression type transistor is connected to the gate electrode of the second block selection transistor, and the gate electrode of the fourth depression type transistor is connected to the gate electrode of the first block selection transistor.

* * * * *